United States Patent
Chen et al.

(10) Patent No.: US 7,432,782 B2
(45) Date of Patent: Oct. 7, 2008

(54) SIGNAL SPLITTER

(75) Inventors: Yung-Sheng Chen, Kaohsiung County (TW); Wen-Chung Liu, Kaohsiung County (TW)

(73) Assignee: YCL Electronics Co., Ltd., Feng Shan, Kaohsiung County (TW)

( * ) Notice: Subject to any disclaimer, the term of this patent is extended or adjusted under 35 U.S.C. 154(b) by 197 days.

(21) Appl. No.: 11/518,032

(22) Filed: Sep. 8, 2006

(65) Prior Publication Data

US 2008/0061904 A1   Mar. 13, 2008

(51) Int. Cl.
*H04B 3/28* (2006.01)
*H03H 7/46* (2006.01)
*H03H 7/01* (2006.01)

(52) U.S. Cl. .................. 333/132; 333/12; 333/24 R; 333/177

(58) Field of Classification Search .............. 333/12, 333/24 R, 132, 177
See application file for complete search history.

(56) References Cited

U.S. PATENT DOCUMENTS

| | | | |
|---|---|---|---|
| 5,109,206 A * | 4/1992 | Carlile | 333/177 |
| 6,407,987 B1 * | 6/2002 | Abraham | 370/295 |
| 6,897,764 B2 * | 5/2005 | Cern | 375/258 |
| 7,039,360 B2 * | 5/2006 | Sugiura | 455/63.1 |

* cited by examiner

*Primary Examiner*—Robert J. Pascal
*Assistant Examiner*—Kimberly E Glenn
(74) *Attorney, Agent, or Firm*—David N. Lathrop, Esq.; Gallagher & Lathrop

(57) ABSTRACT

A signal splitter includes a low-pass filter circuit for permitting a low-frequency component of an incoming signal in an incoming telephone line coupled to a first connecting port to pass therethrough to a second connecting port, and a coupling circuit including a capacitor coupled between a first terminal of the first connecting port and a second terminal of the second connecting port, and a coupling transformer having a primary winding that interconnects the first terminal of the first connecting port and a first input end of the low-pass filter circuit, and a secondary winding that interconnects the second terminal of the second connecting port and a second output end of the low-pass filter circuit.

1 Claim, 2 Drawing Sheets

SIGNAL SPLITTER

BACKGROUND OF THE INVENTION

1. Field of the Invention

The invention relates to a signal splitter, more particularly to a signal splitter capable of reducing cross-talk phenomenon.

2. Description of the Related Art

FIGS. 1 and 2 illustrate a conventional signal splitter 81 that can be coupled among an incoming telephone line 82, a telephony instrument 83 and a digital subscriber line (DSL) modem 84, and that includes a first connecting port 813, a second connecting port 812 and a low-pass filter circuit 811. The first connecting port 813 is to be coupled to the incoming telephone line 82, and has first and second terminals 8131, 8132. The second connecting port 812 is to be coupled to the telephony instrument 83, and has first and second terminals 8121, 8122. The low-pass filter circuit 811 has first and second input ends 8111, 8112 connected electrically and respectively to the first and second terminals 8131, 8132 of the first connecting port 813, and first and second output ends 8113, 8114 connected electrically and respectively to the first and second terminals 8121, 8122 of the second connecting port 812. The low-pass filter circuit 811 is capable of permitting a low-frequency component of an incoming signal in the incoming telephone line 82 to pass therethrough to the second connecting port 812 in a known manner.

It is noted that, since the first connecting port 813 is disposed adjacent to the second connecting port 812 due to physical restrictions imposed by the environment of application, a high-frequency noise signal is easily induced by a high-frequency component of the incoming signal in the incoming telephone line 82 upon the second connecting port 812. Due to the induced high-frequency noise signal, cross-talk phenomenon is unavoidable.

SUMMARY OF THE INVENTION

Therefore, the object of the present invention is to provide a signal splitter that can overcome the aforesaid drawback of the prior art.

According to the present invention, a signal splitter comprises:

a first connecting port adapted to be coupled to an incoming telephone line and having first and second terminals;

a second connecting port adapted to be coupled to a telephony instrument and having first and second terminals;

a low-pass filter circuit having first and second input ends connected electrically and respectively to the first and second terminals of the first connecting port, and first and second output ends connected electrically and respectively to the first and second terminals of the second connecting port, the low-pass filter circuit being capable of permitting a low-frequency component of an incoming signal in the incoming telephone line to pass therethrough to the second connecting port; and a coupling circuit including a coupling transformer having a primary winding that interconnects the first terminal of the first connecting port and the first input end of the low-pass filter circuit, and a secondary winding that interconnects the second terminal of the second connecting port and the second output end of the low-pass filter circuit, and a capacitor coupled between the first terminal of the first connecting port and the second terminal of the second connecting port.

The coupling circuit is operable to generate a coupling signal at the second connecting port to cancel a high-frequency noise signal induced by a high-frequency component of the incoming signal in the incoming telephone line upon the second connecting port.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
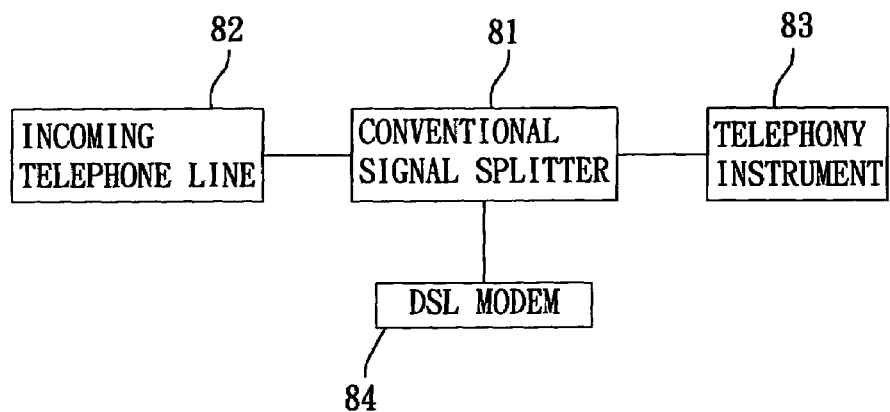
FIG. 1 is a schematic circuit block diagram illustrating a connecting relationship of a conventional signal splitter with an incoming telephone line, a telephony instrument and a DSL modem.
Figure 2:
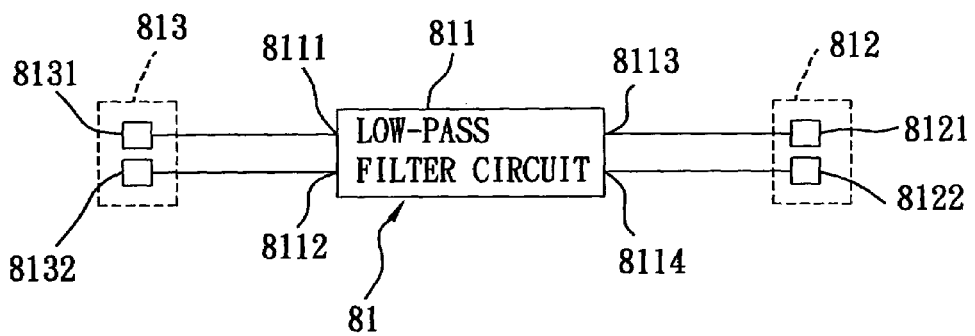
FIG. 2 is a schematic circuit block diagram of the conventional signal splitter.
Figure 3:
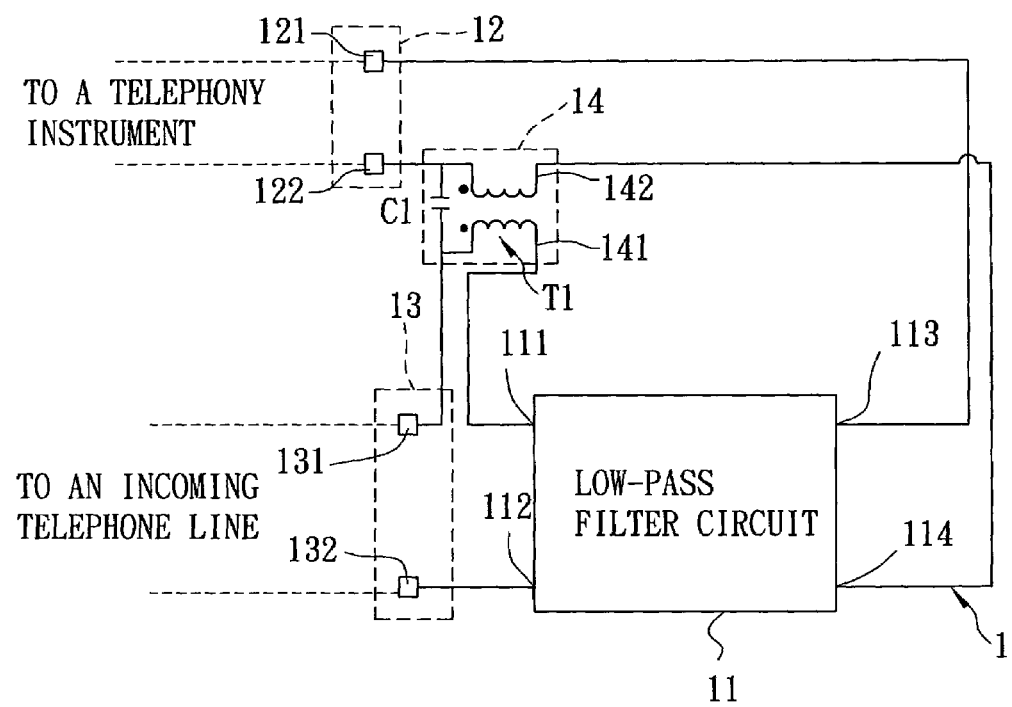
FIG. 3 is a schematic circuit block diagram illustrating the preferred embodiment of a signal splitter according to the present invention.

Referring to FIG. 3, the preferred embodiment of a signal splitter 1 according to the present invention is shown to include a first connecting port 13, a second connecting port 12, a low-pass filter circuit 11, and a coupling circuit 14.

The first connecting port 13 is adapted to be coupled to an incoming telephone line, and has first and second terminals 131, 132.

The second connecting port 12 is adapted to be coupled to a telephony instrument, and has first and second terminals 121, 122.

The low-pass filter circuit 11 has first and second input ends 111, 112 connected electrically and respectively to the first and second terminals 131, 132 of the first connecting port 13, and first and second output ends 113, 114 connected electrically and respectively to the first and second terminals 121, 122 of the second connecting port 12. The low-pass filter circuit 11 is capable of permitting a low-frequency component of an incoming signal in the incoming telephone line to pass therethrough to the second connecting port 12 in a known manner.

Since the feature of the invention does not reside in the configuration of the low-pass filter circuit 11, which is conventional, details of the same are omitted herein for the sake of brevity.

The coupling circuit 14 includes a coupling transformer (T1) and a capacitor (C1). In this embodiment, the coupling transformer (T1) includes a common core (not shown), a primary winding 141 that is wound on the common core and that interconnects the first terminal 131 of the first connecting port 13 and the first input end 111 of the low-pass filter circuit 11, and a secondary winding 142 that is wound on the common core and that interconnects the second terminal 122 of the second connecting port 12 and the second output end 114 of the low-pass filter circuit 11. As such, a phase difference between a signal passing through the primary winding 141 and a signal passing through the secondary winding 142 is 180°. The capacitor (C1) is coupled between the first terminal 131 of the first connecting port 13 and the second terminal 122 of the second connecting port 12.

The coupling circuit 14 is operable to generate a coupling signal at the second connecting port 12 based on a high-frequency component of the incoming signal in the incoming telephone line. At the same time, a high-frequency noise signal is induced by the high-frequency component of the incoming signal in the incoming telephone line upon the second connecting port 12. Since the coupling signal generated by the coupling circuit 14 has a magnitude substantially equal to that of the high-frequency noise signal induced upon the second connecting port 12, and since the phase difference between the coupling signal and the high-frequency noise signal is 180°, the high-frequency noise signal is cancelled by the coupling signal, thereby minimizing the effect of crosstalk phenomenon.

The signal splitter 1 of this invention further includes a modem interface (not shown) for coupling with a DSL modem, such as an Asymmetric Digital Subscriber Line (ADSL) modem, an Integrated Digital Subscriber Line (IDSL) modem, a High-bit-rate Digital Subscriber Line (HDSL) modem, a Single-pair Digital Subscriber Line (SDSL) modem, a Very High Data Rate Subscriber Line (VDSL) modem, etc. The modem interface permits the high-frequency component of the incoming signal in the incoming telephone line to pass therethrough to the DSL modem. Since the feature of the invention does not reside in the configuration of the modem interface, which is conventional, details of the same are omitted herein for the sake of brevity.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A signal splitter comprising:

a first connecting port adapted to be coupled to an incoming telephone line and having first and second terminals;

a second connecting port adapted to be coupled to a telephony instrument and having first and second terminals;

a low-pass filter circuit having first and second input ends connected electrically and respectively to said first and second terminals of said first connecting port, and first and second output ends connected electrically and respectively to said first and second terminals of said second connecting port, said low-pass filter circuit being capable of permitting a low-frequency component of an incoming signal in the incoming telephone line to pass therethrough to said second connecting port; and a coupling circuit including a coupling transformer having a primary winding that interconnects said first terminal of said first connecting port and said first input end of said low-pass filter circuit, and a secondary winding that interconnects said second terminal of said second connecting port and said second output end of said low-pass filter circuit, and a capacitor coupled between said first terminal of said first connecting port and said second terminal of said second connecting port, whereby, said coupling circuit is operable to generate a coupling signal at said second connecting port to cancel a high-frequency noise signal induced by a high-frequency component of the incoming signal in the incoming telephone line upon said second connecting port.

* * * * *